(12) United States Patent
Fukunaga

(10) Patent No.: US 6,396,863 B1
(45) Date of Patent: May 28, 2002

(54) HIGH-POWER SEMICONDUCTOR LASER DEVICE HAVING INDEX-GUIDED STRUCTURE WITH INALGAP CURRENT CONFINEMENT LAYER

(75) Inventor: Toshiaki Fukunaga, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 18 days.

(21) Appl. No.: 09/634,704

(22) Filed: Aug. 7, 2000

(30) Foreign Application Priority Data

Aug. 5, 1999 (JP) .......................................... 11-222171

(51) Int. Cl.$^7$ ................................................ H01S 5/00
(52) U.S. Cl. ............................................ 372/46; 372/45
(58) Field of Search ...................................... 372/46, 45

(56) References Cited

U.S. PATENT DOCUMENTS

| 5,361,271 A | * | 11/1994 | Takiguchi et al. ............. 372/46 |
| 5,838,028 A | * | 11/1998 | Horie et al. ................... 372/46 |
| 5,933,443 A | * | 8/1999 | Mushiage et al. ............. 372/46 |
| 5,949,809 A | * | 9/1999 | Ashida ......................... 372/46 |
| 6,055,255 A | * | 4/2000 | Suyama et al. ............... 372/46 |

OTHER PUBLICATIONS

Akihiro Shima, et al "0.78–and 0.98–$\mu$m Ridge–Waveguide Lasers Buried with AlGaAs Confinement Layer Selectively Grown by Chloride–Assisted MOCVD", Jun. 1995, vol. 1, No. 2, IEEE Journal of Selected topics in Quantum Electronics, pp. 102–109.

Shin Ishikawa, et al "0.98–1.02 $\mu$m Strained InGaAs Double Quantum–Well High–Power Lasers with GaInP Buried Waveguides", Jun. 1993, vol. 29, No. 6, IEEE Journal of Quantum Electonics, pp. 1936–1942.

M. Sagawa, et al "High–Power Highly–Reliable Operation of 0.98–$\mu$m InGaAs–InGaP Strain–Compensated Single–Quantum–Well Lasers with Tensile–Strained InGaAsP Barriers"' Jun. 1995, vol. 1, No. 2, IEEE Journal of Selected topics in Quantum Electronics, pp. 189–194.

Osamu Imafuji, et al "600 mW CW Single–Mode GaAlAs Triple–Quantum–Well Laser with a New Index Guided Structure", Jun. 1993, vol. 29, No. 6, IEEE Journal of Quantum Electronics, pp. 1889–1894.

* cited by examiner

*Primary Examiner*—Quyen Leung
(74) *Attorney, Agent, or Firm*—Sughrue Mion, PLLC

(57) ABSTRACT

In a semiconductor laser device: an n-type lower cladding layer; a lower optical waveguide layer; a compressive strain quantum well active layer made of $In_{x3}Ga_{1-x3}As_{1-y3}P_{y3}$, where $0<x3\leq 0.4$ and $0\leq y3\leq 0.1$; an upper optical waveguide layer; a p-type $In_{0.49}Ga_{0.51}P$ first upper cladding layer; an etching stop layer made of $In_{x1}Ga_{1-x1}As_{1-y1}P_{y1}$, where $0\leq x1\leq 0.3$ and $0\leq y1\leq 0.6$; an n-type current confinement layer made of $In_{0.49}(Al_{z1}Ga_{1-z1})_{0.51}P$, where $0\leq z1\leq 0.1$; an $In_{0.49}Ga_{0.51}P$ cap layer; a p-type second upper cladding layer made of $In_{x4}Ga_{1-x4}As_{1-y4}P_{y4}$, where $x4=(0.49\pm 0.01)y4$ and $0.9\leq y4\leq 1$; and a p-type contact layer are formed on an n-type GaAs substrate in this order. Each of the etching stop layer, the current confinement layer, and the cap layer has a stripe-shape opening realizing a current injection window filled with the second upper cladding layer. The absolute value of the product of the strain and the thickness of the compressive strain quantum well active layer is equal to or smaller than 0.25 nm; and the absolute value of the product of the strain and the thickness of the etching stop layer is equal to or smaller than 0.25 nm. Each of the lower cladding layer, the lower optical waveguide layer, the upper optical waveguide layer, the first upper cladding layer, the current confinement layer, the cap layer, the second upper cladding layer, and the contact layer has such a composition as to lattice-match with the GaAs substrate.

13 Claims, 4 Drawing Sheets

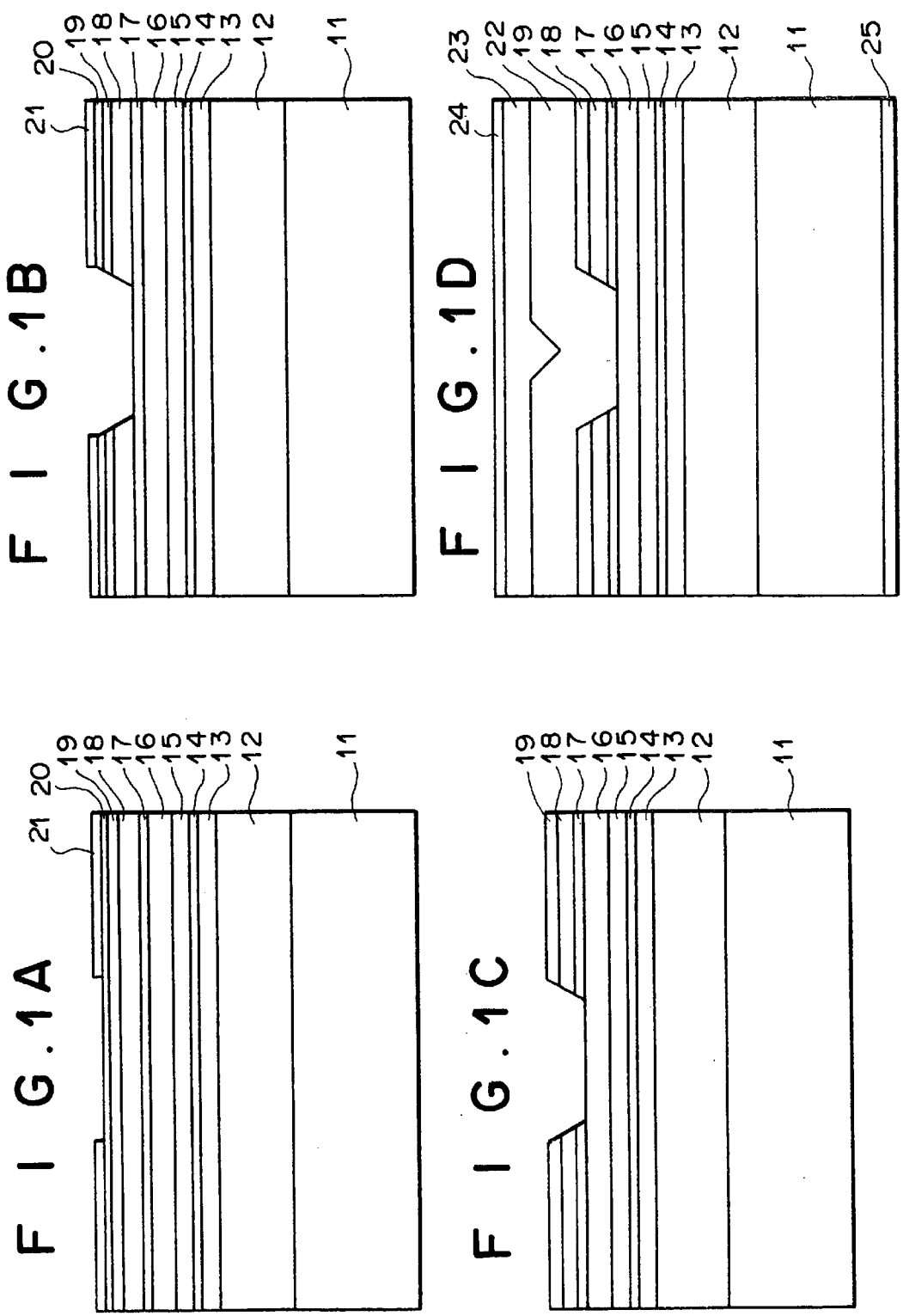

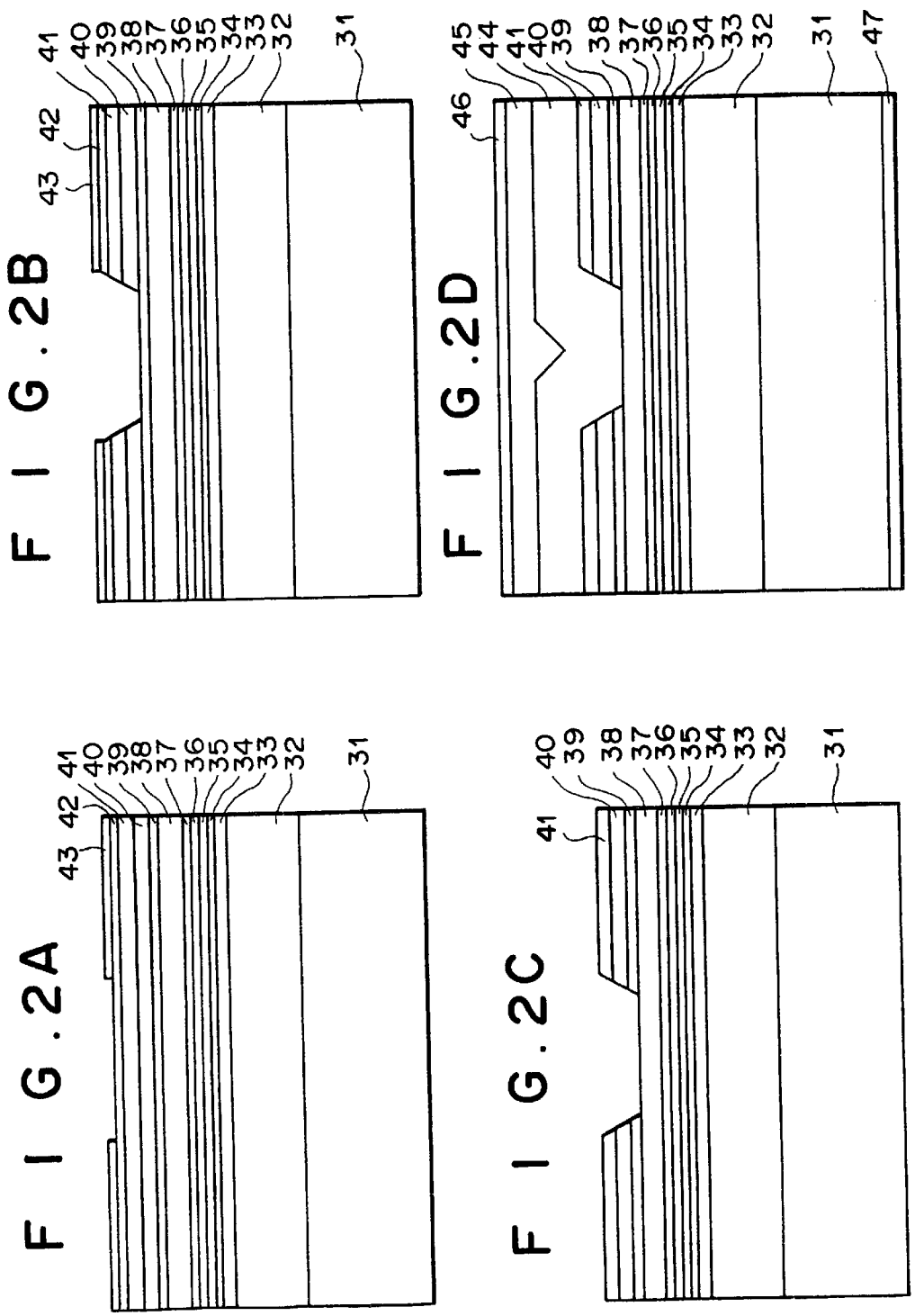

HIGH-POWER SEMICONDUCTOR LASER DEVICE HAVING INDEX-GUIDED STRUCTURE WITH INALGAP CURRENT CONFINEMENT LAYER

BACKGROUND OF THE INVENTION

1. Field of the Invention

The present invention relates to a semiconductor laser device having an internal current confinement structure, and a process for producing a semiconductor light emitting device having an internal current confinement structure.

2. Description of the Related Art (1) In many conventional current semiconductor laser devices which emit light in the 0.9 to 1.1 μm band, a current confinement structure and an index-guided structure are provided in crystal layers which constitute the semiconductor laser devices so that the semiconductor laser device oscillates in a fundamental transverse mode. For example, IEEE Journal of Selected Topics in Quantum Electronics, vol. 1, No. 2, 1995, pp.102 discloses a semiconductor laser device which emits light in the 0.98 μm band. This semiconductor laser device is formed as follows.

On an n-type GaAs substrate, an n-type $Al_{0.48}Ga_{0.52}As$ lower cladding layer, an undoped $Al_{0.2}Ga_{0.8}As$ optical waveguide layer, an $Al_{0.2}Ga_{0.8}As/In_{0.2}Ga_{0.8}As$ double quantum well active layer, an undoped $Al_{0.2}Ga_{0.8}As$ optical waveguide layer, a p-type AlGaAs first upper cladding layer, a p-type $Al_{0.67}Ga_{0.33}As$ etching stop layer, a p-type $Al_{0.48}Ga_{0.52}As$ second upper cladding layer, a p-type GaAs cap layer, and an insulation film are formed in this order. Next, a narrow-stripe ridge structure is formed above the p-type $Al_{0.67}Ga_{0.33}As$ etching stop layer by normal photolithography and selective etching, and n-type $Al_{0.7}Ga_{0.3}As$ and n-type GaAs materials are embedded in both sides of the ridge structure by selective MOCVD using Cl gas. Then, the insulation film is removed, and thereafter a p-type GaAs layer is formed. Thus, a current confinement structure and an index-guided structure are built in the semiconductor laser device.

However, the above semiconductor laser device has a drawback that it is very difficult to form the AlGaAs second upper cladding layer on the AlGaAs first upper cladding layer, since the AlGaAs first upper cladding layer contains a high Al content and is prone to oxidation, and selective growth of the AlGaAs second upper cladding layer is difficult.

(2) In addition, IEEE Journal of Quantum Electronics, vol. 29, No. 6, 1993, pp.1936 discloses a semiconductor laser device which oscillates in a fundamental transverse mode, and emits light in the 0.98 to 1.02 μm band. This semiconductor laser device is formed as follows.

On an n-type GaAs substrate, an n-type $Al_{0.4}Ga_{0.6}As$ lower cladding layer, an undoped $Al_{0.2}Ga_{0.8}As$ optical waveguide layer, a GaAs/InGaAs double quantum well active layer, an undoped $Al_{0.2}Ga_{0.8}As$ optical waveguide layer, a p-type $Al_{0.4}Ga_{0.5}As$ upper cladding layer, a p-type GaAs cap layer, and an insulation film are formed in this order. Next, a narrow-stripe ridge structure is formed above a mid-thickness of the p-type $Al_{0.4}Ga_{0.6}As$ upper cladding layer by normal photolithography and selective etching, and an n-type $In_{0.5}Ga_{0.5}P$ material and an n-type GaAs material are embedded in both sides of the ridge structure by selective MOCVD. Finally, the insulation film is removed, and then electrodes are formed. Thus, a current confinement structure and an index-guided structure are realized in the layered construction.

However, the above semiconductor laser device also has a drawback that it is very difficult to form the InGaP layer on the AlGaAs upper cladding layer, since the AlGaAs upper cladding layer contains a high Al content and is prone to oxidation, and it is difficult to grow an InGaP layer having a different V-group component, on such an upper cladding layer.

(3) Further, IEEE Journal of Selected Topics in Quantum Electronics, vol. 1, No. 2, 1995, pp.189 discloses an all-layer-Aluminum-free semiconductor laser device which oscillates in a fundamental transverse mode, and emits light in the 0.98 μm band. This semiconductor laser device is formed as follows.

On an n-type GaAs substrate, an n-type InGaP cladding layer, an undoped InGaAsP optical waveguide layer, an InGaAsP tensile strain barrier layer, an InGaAs double quantum well active layer, an InGaAsP tensile strain barrier layer, an undoped InGaAsP optical waveguide layer, a p-type InGaP first upper cladding layer, a p-type GaAs optical waveguide layer, a p-type InGaP second upper cladding layer, a p-type GaAs cap layer, and an insulation film are formed in this order. Next, a narrow-stripe ridge structure is formed above the p-type InGaP first upper cladding layer by normal photolithography and selective etching, and an n-type $In_{0.5}Ga_{0.5}P$ material is embedded in both sides of the ridge structure by selective MOCVD. Finally, the insulation film is removed, and a p-type GaAs contact layer is formed. Thus, a current confinement structure and an index-guided structure are realized.

The reliability of the above semiconductor laser device is improved since the strain in the active layer can be compensated for. However, the above semiconductor laser device also has a drawback that the kink level is low (about 150 mW) due to poor controllability of the ridge width.

(4) Furthermore, IEEE Journal of Quantum Electronics, vol. 29, No. 6, 1993, pp.1889 discloses an internal striped structure semiconductor laser device which oscillates in a fundamental transverse mode, and emits light in the 0.8 μm band. This semiconductor laser device is formed as follows.

On an n-type GaAs substrate, an n-type AlGaAs lower cladding layer, an AlGaAs/GaAs triple quantum well active layer, a p-type AlGaAs first upper cladding layer, an n-type AlGaAs current confinement layer, and an n-type AlGaAs protection layer are formed in this order. Next, a narrow-stripe groove is formed, by normal photolithography and selective etching, to such a depth that the groove penetrates the n-type AlGaAs current confinement layer. Next, over the above structure, a p-type AlGaAs second upper cladding layer and a p-type GaAs contact layer are formed.

In the above semiconductor laser device, the stripe width can be controlled accurately, and high-output-power oscillation in a fundamental transverse mode can be realized by the difference in the refractive index between the n-type AlGaAs current confinement layer and the p-type AlGaAs second upper cladding layer. However, the above semiconductor laser device also has a drawback that it is difficult to form an AlGaAs layer on another AlGaAs layer since the AlGaAs layers are prone to oxidation.

As described above, in the conventional current semiconductor laser devices which include an internal current confinement structure, oscillate in a fundamental transverse mode, and emit light in the 0.9 to 1.1 μm band, it is difficult to form an upper layer on a current confinement layer when aluminum exists near the boundary of the current confinement layer and the upper layer, since the AlGaAs layers are prone to oxidation. Even if the upper layer can be formed, defects occur at the boundary of the current confinement layer and the upper layer for the same reason.

SUMMARY OF THE INVENTION

An object of the present invention is to provide a reliable semiconductor laser device which can oscillate in a fundamental transverse mode even when output power is high.

Another object of the present invention is to provide a process for producing a reliable semiconductor laser device which can oscillate in a fundamental transverse mode even when output power is high.

(1) According to the first aspect of the present invention, there is provided a semiconductor laser device including: a GaAs substrate of a first conductive type; a lower cladding layer of the first conductive type, formed on the GaAs substrate; a lower optical waveguide layer formed on the lower cladding layer; a compressive strain quantum well active layer made of $In_{x3}Ga_{1-x3}As_{1-y3}P_{y3}$, and formed on the lower optical waveguide layer, where $0<x3\leq0.4$, $0\leq y3\leq0.1$, and the absolute value of a first product of the strain and the thickness of the compressive strain quantum well active layer is equal to or smaller than 0.25 nm; an upper optical waveguide layer formed on the $In_{x3}Ga_{1-x3}As_{1-y3}P_{y3}$ compressive strain quantum well active layer; a first upper cladding layer made of $In_{0.49}Ga_{0.51}P$ of a second conductive type, and formed on the upper optical waveguide layer; an etching stop layer made of $In_{x1}Ga_{1-x1}As_{1-y1}P_{y1}$, and formed on the first upper cladding layer other than a stripe area of the first upper cladding layer so as to form a first portion of a stripe groove realizing a current injection window, where $0\leq x1\leq0.3$, $0\leq y1\leq0.6$, and an absolute value of a second product of a strain and a thickness of the etching stop layer is equal to or smaller than 0.25 nm; a current confinement layer made of $In_{0.49}(Al_{z1}Ga_{1-z1})_{0.51}P$ of the first conductive type, and formed on the etching stop layer so as to form a second portion of the stripe groove, where $0\leq z1\leq0.1$; a cap layer made of $In_{0.49}Ga_{0.51}P$, and formed on the current confinement layer so as to form a third portion of the stripe groove; a second upper cladding layer made of $In_{x4}Ga_{1-x4}As_{1-y4}P_{y4}$ of the second conductive type, and formed on the current confinement layer and the stripe area of the first upper cladding layer, where $x4=(0.49\pm0.01)y4$ and $0.9\leq y4\leq1$; and a contact layer of the second conductive type, formed on the second upper cladding layer. In the semiconductor laser device, each of the lower cladding layer, the lower optical waveguide layer, the upper optical waveguide layer, the first upper cladding layer, the current confinement layer, the cap layer, the second upper cladding layer, and the contact layer has such a composition as to lattice-match with the GaAs substrate.

The first conductive type is different in polarity of carriers from the second conductive type. That is, when the first conductive type is n type, and the second conductive type is p type.

The strain of the compressive strain quantum well active layer is defined as $(c_a-c_s)/c_s$, where $c_s$ and $c_a$ are the lattice constants of the GaAs substrate and the compressive strain quantum well active layer, respectively.

The strain of the etching stop layer is defined as $(c_s-c_s)/c_s$, where $c_s$ and $c_s$ are the lattice constants of the GaAs substrate and the etching stop layer, respectively.

When a layer grown over the substrate has a lattice constant c, and an absolute value of the amount $(c-c_s)/c_s$ is equal to or smaller than 0.003, the layer is lattice-matched with the substrate. That is, in the semiconductor laser devices according to the first and second aspects of the present invention, the absolute value of the amount $(c-c_s)/c_s$ is equal to or smaller than 0.003 for each of the lower cladding layer, the lower optical waveguide layer, the upper optical waveguide layer, the first upper cladding layer, the current confinement layer, and the second upper cladding layer.

Preferably, the semiconductor laser device according to the first aspect of the present invention may also have one or any possible combination of the following additional features (i) to (vi).

(i) The semiconductor laser device may further include first and second tensile strain barrier layers both made of $In_{x5}Ga_{1-x5}As_{1-y5}P_{y5}$, and respectively formed above and below the compressive strain quantum well active layer, where $0\leq x5\leq0.3$ and $0<y5\leq0.6$, and the absolute value of a sum of the first product and a third product of the strain of the first and second tensile strain barrier layers and a total thickness of the first and second tensile strain barrier layers is equal to or smaller than 0.25 nm. The strain of the first and second tensile strain barrier layers is defined as $(c_b-c_s)/c_s$, where $c_b$ is the lattice constant of the first and second tensile strain barrier layers.

(ii) The etching stop layer may be one of the first and second conductive types.

(iii) The first cap layer may be one of the first and second conductive types and an undoped type.

(iv) The lower optical waveguide active layer may be the first conductive type, and the upper optical waveguide active layer is the second conductive type.

(v) The compressive strain quantum well active layer may have a multiple quantum well structure.

(vi) The stripe groove may have a width equal to or greater than 1 $\mu$m.

(2) According to the second aspect of the present invention, there is provided a process for producing a semiconductor laser device, including the steps of: (a) forming a lower cladding layer of a first conductive type on a GaAs substrate of the first conductive type; (b) forming a lower optical waveguide layer on the lower cladding layer; (c) forming a compressive strain quantum well active layer made of $In_{x3}Ga_{1-x3}As_{1-y3}P_{y3}$, on the lower optical waveguide layer, where $0<x3\leq0.4$, $0\leq y3\leq0.1$, and the absolute value of a first product of the strain and the thickness of the compressive strain quantum well active layer is equal to or smaller than 0.25 nm; (d) forming an upper optical waveguide layer on the $In_{x3}Ga_{1-x3}As_{1-y3}P_{y3}$ compressive strain quantum well active layer; (e) forming a first upper cladding layer made of $In_{0.49}Ga_{0.51}P$ of a second conductive type, on the upper optical waveguide layer; (f) forming an etching stop layer made of $In_{x1}Ga_{1-x1}As_{1-y1}P_{y1}$, on the first upper cladding layer, where $0\leq x1\leq0.3$ and $0\leq y1\leq0.6$, and the absolute value of a second product of the strain and the thickness of the etching stop layer is equal to or smaller than 0.25 nm; (g) forming a current confinement layer made of $In_{0.49}(Al_{z1}Ga_{1-z1})_{0.51}P$ of the first conductive type, on the etching stop layer, where $0\leq z1\leq0.1$; (h) forming a first cap layer made of $In_{0.49}Ga_{0.51}P$, on the current confinement layer; (i) removing a stripe area of the first cap layer and a stripe area of the current confinement layer so as to form a first portion of a stripe groove for realizing a current injection window; (j) removing a stripe area of the etching stop layer so as to form a second portion of the stripe groove; (k) forming a second upper cladding layer made of $In_{x4}Ga_{1-x4}As_{1-y4}P_{y4}$ of the second conductive type so that the stripe groove is covered with the second upper cladding layer, where $x4=(0.49\pm0.01)y4$ and $0.9\leq y4\leq 1$; and (l) forming a contact layer of the second conductive type, on the second upper cladding layer. In the process, each of the lower cladding layer, the lower optical waveguide layer, the upper optical waveguide layer, the first upper cladding layer, the current confinement layer, the first cap layer, the second upper cladding layer, and the contact layer has such a composition as to lattice-match with the GaAs substrate.

That is, the semiconductor laser device according to the first aspect of the present invention can be produced by the process according to the second aspect of the present invention.

Preferably, the process according to the second aspect of the present invention may also have one or any possible combination of the following additional features (vii) to (xi).

(vii) The process may further include, after the step (h), the steps of, (hi) forming a second cap layer made of GaAs, and (h2) removing a stripe area of the second cap layer. In addition, in the step (j), a remaining area of the second cap layer is removed together with the stripe area of the etching stop layer so as to form an additional portion of the stripe groove.

(viii) The etching stop layer may be one of the first and second conductive types.

(ix) The first cap layer may be one of the first and second conductive types and an undoped type.

(x) The second cap layer may be one of the first and second conductive types and an undoped type.

(xi) The process may further include the steps of, (b1) after the step (b), forming a first tensile strain barrier layer made of $In_{x5}Ga_{1-x5}As_{1-y5}P_{y5}$, on the lower optical waveguide layer, where $0\leq x5\leq 0.3$ and $0<y5\leq 0.6$, and (c1) after the step (c), forming a second tensile strain barrier layer made of $In_{x5}Ga_{1-x5}As_{1-y5}P_{y5}$, on the compressive strain quantum well active layer, where an absolute value of a sum of the first product and a third product of a strain of the first and second tensile strain barrier layers and a total thickness of the first and second tensile strain barrier layers is equal to or smaller than 0.25 nm.

(3) The first and second aspects of the present invention have the following advantages.

(a) When aluminum exists near a boundary surface on which the second upper cladding layer is formed, the boundary surface is prone to oxidation. However, in step (k) of the process according to the second aspect of the present invention, aluminum exists in only the $In_{0.49}(Al_{z1}Ga_{1-z1})_{0.51}P$ current confinement layer, which appears in only the side surfaces of the stripe groove. In addition, the aluminum content in the $In_{0.49}(Al_{z1}Ga_{1-z1})_{0.51}P$ current confinement layer does not exceed 10%. Therefore, it is easy to form the second upper cladding layer, and the characteristics of the semiconductor laser device do not deteriorate, and reliability is improved.

(b) In the semiconductor laser device according to the first aspect of the present invention, the current confinement layer is made of $In_{0.49}(Al_{z1}Ga_{1-z1})_{0.51}P$, and the second upper cladding layer is made of $In_{x4}Ga_{1-x4}As_{1-y4}P_{y4}$. Therefore, the difference in the refractive indexes between the current confinement layer and the second upper cladding layer realizes a difference of about $1.5\times 10^{-3}$ to $7\times 10^{-3}$ in the equivalent refractive index of the active layer between the portion under the current confinement layer and the portion under the stripe groove, with high accuracy, and it is possible to cut off oscillation in higher modes. Thus, oscillation in the fundamental transverse mode can be maintained even when the output power becomes high.

(c) The etching stop layer is made of InGaP. Therefore, when a hydrochloric acid etchant is used, InGaAsP layers under the etching stop layer are not etched. That is, when a hydrochloric acid etchant is used, it is possible to accurately stop etching at the lower boundary of the first upper cladding layer. Thus, the stripe width can be accurately controlled, and the index-guided structure can be built in with high accuracy.

(d) Since the current confinement layer is arranged within the semiconductor laser device, it is possible to increase the contact area between the electrode and the contact layer. Therefore, the contact resistance can be reduced.

(e) When the tensile strain barrier layers are provided as described in the paragraphs (1)(i), various characteristics are improved (e.g., the threshold current is lowered), and reliability is increased.

(f) When the GaAs second cap layer is used as described in paragraph (2)(vii), it is possible to prevent formation of a natural oxidation film on the InGaP first cap layer, and metamorphic change in the InGaP first cap layer, which may occur when a resist layer is formed directly on the InGaP first cap layer. In addition, since the GaAs second cap layer is removed before the second upper cladding layer is formed, it is possible to remove a residue left on a boundary surface on which the second upper cladding layer is formed, and prevent occurrence of crystal defects.

DESCRIPTION OF THE DRAWINGS

FIGS. 1A to 1D are cross-sectional views of representative stages in the process for producing a semiconductor laser device as the first embodiment.

FIGS. 2A to 2D are cross-sectional views of representative stages in the process for producing a semiconductor laser device as the second embodiment.

DESCRIPTION OF PREFERRED EMBODIMENTS

Figure 3B:
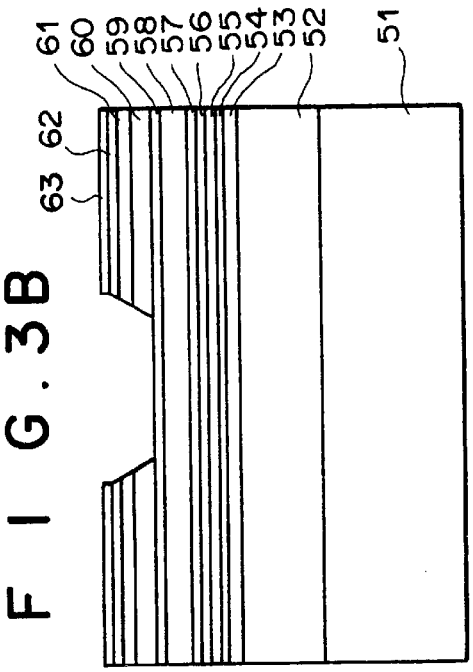
FIGS. 3A to 3D are cross-sectional views of representative stages in the process for producing a semiconductor laser device as the third embodiment.

Embodiments of the present invention are explained in detail below with reference to drawings.

First Embodiment

FIGS. 1A to 1D show cross sections of the representative stages in the process for producing a semiconductor laser device as the first embodiment, where the cross sections are perpendicular to the direction of light emitted from the semiconductor laser device.

First, as illustrated in FIG. 1A, an n-type $In_{0.49}Ga_{0.51}P$ lower cladding layer 12, an n-type or i-type (intrinsic) $In_{x2}Ga_{1-x2}As_{1-y2}P_{y2}$ optical waveguide layer 13 ($x2=(0.49\pm0.01)y2$, $0\leq x2\leq 0.3$), an $In_{x3}Ga_{1-x3}As_{1-y3}P_{y3}$ compressive strain quantum well active layer 14 ($0<x3\leq 0.4$, $0\leq y3\leq 0.1$), a p-type or i-type (intrinsic) $In_{x2}Ga_{1-x2}$ $As_{1-y2}P_{y2}$ optical waveguide layer 15 (x2=(0.49±0.01)y2, 0≦x2≦0.3), a p-type $In_{0.49}Ga_{0.51}P$ first upper cladding layer 16, an n-type or p-type $In_{x1}Ga_{1-x1}As_{1-y1}P_{y1}$ etching stop layer 17 (0≦x1≦0.3, 0≦y1≦0.6) having a thickness of, for example, 20 nm, an n-type $In_{0.49}(Al_{z1}Ga_{1-z1})_{0.51}P$ current confinement layer 18 (0≦z1≦0.1) having a thickness of, for example, 1 μm, an n-type $In_{0.49}Ga_{0.51}P$ cap layer 19, and a GaAs cap layer 20 having a thickness of, for example, 10 nm are formed on an n-type GaAs substrate 11 by organometallic vapor phase epitaxy. Then, a $SiO_2$ film 21 is formed over the GaAs cap layer 20, and a stripe area having a width of about 3 μm and extending in the <011> direction, of the $SiO_2$ film 21 is removed by normal photolithography.

Next, as illustrated in FIG. 1B, the GaAs cap layer 20 is etched with a sulfuric acid etchant by using the $SiO_2$ film 21 as a mask. Then, the stripe areas of the n-type $In_{0.49}Ga_{0.51}P$ cap layer 19 and the n-type $In_{0.49}(Al_{z1}Ga_{1-z1})_{0.51}P$ current confinement layer 18 are etched with a hydrochloric acid etchant until the n-type or p-type $In_{x1}Ga_{1-x1}As_{1-y1}P_{y1}$ etching stop layer 17 is exposed.

Thereafter, as illustrated in FIG. 1C, the remaining areas of the $SiO_2$ film 21 are removed by etching using a fluoric acid etchant. Then, the n-type GaAs cap layer 20 and the exposed area of the n-type or p-type $In_{x1}Ga_{1-x1}As_{1-y1}P_{y1}$ etching stop layer 17 are removed by etching using a sulfuric acid etchant.

Finally, as illustrated in FIG. 1D, a p-type $In_{x4}Ga_{1-x4}As_{1-y4}P_{y4}$ second upper cladding layer 21 (x4=(0.49±0.01)y4, 0.9≦y4≦1) and a p-type GaAs contact layer 22 are formed over the construction of FIG. 1C. Then, a p electrode 24 is formed on the p-type GaAs contact layer 23. In addition, the exposed surface of the substrate 11 is polished, and an n electrode 25 is formed on the polished surface of the substrate 11. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type $In_{0.49}Ga_{0.51}P$ first upper cladding layer 16 has such thickness that oscillation in a fundamental transverse mode can be maintained even when output power becomes high. In addition, since a current confinement structure and a real refractive index structure are realized by the provision of the p-type $In_{x4}Ga_{1-x4}As_{1-y4}P_{y4}$ second upper cladding layer 21 and the n-type $In_{0.49}(Al_{z1}Ga_{1-z1})_{0.51}P$ current confinement layer 18, it is possible to realize a difference of about $1.5 \times 10^{-3}$ to $7 \times 10^{-3}$ in the equivalent refractive index of the active layer between the portion under the current confinement layer and the portion under the stripe area. Therefore, oscillation in a fundamental transverse mode can be maintained even when the output power becomes high.

Second Embodiment

FIGS. 2A to 2D show cross sections of the representative stages in the process for producing a semiconductor laser device as the second embodiment, where the cross sections are perpendicular to the direction of light emitted from the semiconductor laser device.

First, as illustrated in FIG. 2A, an n-type $In_{0.49}Ga_{0.51}P$ lower cladding layer 32, an n-type or i-type $In_{x2}Ga_{1-x2}As_{1-y2}P_{y2}$ optical waveguide layer 33 (x2=(0.49±0.01)y2, 0≦x2≦0.3), an $In_{x5}Ga_{1-x5}As_{1-y5}P_{y5}$ tensile strain barrier layer 34 (0≦x5≦0.3, 0<y5≦0.6), an $In_{x3}Ga_{1-x3}As_{1-y3}P_{y3}$ compressive strain quantum well active layer 35 (0<x3≦0.4, 0≦y3≦0.1), an $In_{x5}Ga_{1-x5}As_{1-y5}P_{y5}$ tensile strain barrier layer 36 (0≦x5≦0.3, 0<y5≦0.6), a p-type or i-type $In_{x2}Ga_{1-x2}As_{1-y2}P_{y2}$ optical waveguide layer 37 (x2=(0.49±0.01)y2, 0≦x2≦0.3), a p-type $In_{0.49}Ga_{0.51}P$ first upper cladding layer 38, an n-type or p-type $In_{x1}Ga_{1-x1}As_{1-y1}P_{y1}$ etching stop layer 39 (0≦x1≦0.3, 0≦y1≦0.6) having a thickness of, for example, 20 nm, an n-type $In_{0.49}(Al_{z1}Ga_{1-z1})_{0.51}P$ current confinement layer 40 (0≦z1≦0.1) having a thickness of, for example, 1 μm, an n-type $In_{0.49}Ga_{0.51}P$ cap layer 41, and an n-type GaAs cap layer 42 are formed on an n-type GaAs substrate 31 by organometallic vapor phase epitaxy. Then, a $SiO_2$ film 43 is formed over the n-type GaAs cap layer 42, and a stripe area having a width of about 3 μm and extending in the <011> direction, of the $SiO_2$ film 43 is removed by normal photolithography.

Next, as illustrated in FIG. 2B, the n-type GaAs cap layer 42 is etched with a sulfuric acid etchant by using the $SiO_2$ film 43 as a mask. Then, the stripe areas of the n-type $In_{0.49}Ga_{0.51}P$ cap layer 41 and the n-type $In_{0.49}(Al_{z1}Ga_{1-z1})_{0.51}P$ current confinement layer 40 are etched with a hydrochloric acid etchant until the n-type or p-type $In_{x1}Ga_{1-x1}As_{1-y1}P_{y1}$ etching stop layer 39 is exposed.

Thereafter, as illustrated in FIG. 2C, the remaining areas of the $SiO_2$ film 43 are removed by etching using a fluoric acid etchant. Then, the n-type GaAs cap layer 42 and the exposed area of the n-type or p-type $In_{x1}Ga_{1-x1}As_{1-y1}P_{y1}$ etching stop layer 39 are removed by etching using a sulfuric acid etchant.

Finally, as illustrated in FIG. 2D, an $In_{x4}Ga_{1-x4}As_{1-y4}P_{y4}$ second upper cladding layer 44 (x4=(0.49±0.01)y4, 0.9≦y4≦1) and a p-type GaAs contact layer 45 are formed over the construction of FIG. 2C. Then, a p electrode 46 is formed on the p-type GaAs contact layer 45. In addition, the exposed surface of the substrate 31 is polished, and an n electrode 47 is formed on the polished surface of the substrate 31. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type $In_{0.49}Ga_{0.51}P$ first upper cladding layer 38 has such a thickness that oscillation in a fundamental transverse mode can be maintained even when output power becomes high.

In the construction of the second embodiment, the $In_{x3}Ga_{1-x3}As_{1-y3}P_{y3}$ compressive strain quantum well active layer 35 is sandwiched between the $In_{x5}Ga_{1-x5}As_{1-y5}P_{y5}$ tensile strain barrier layers 34 and 36. Therefore, compared with the first embodiment, characteristics are improved (e.g., the threshold current is lowered), and reliability is increased.

Third Embodiment

FIGS. 3A to 3D show cross sections of the representative stages in the process for producing a semiconductor laser device as the third embodiment, where the cross sections are perpendicular to the direction of light emitted from the semiconductor laser device.

Figure 3D:
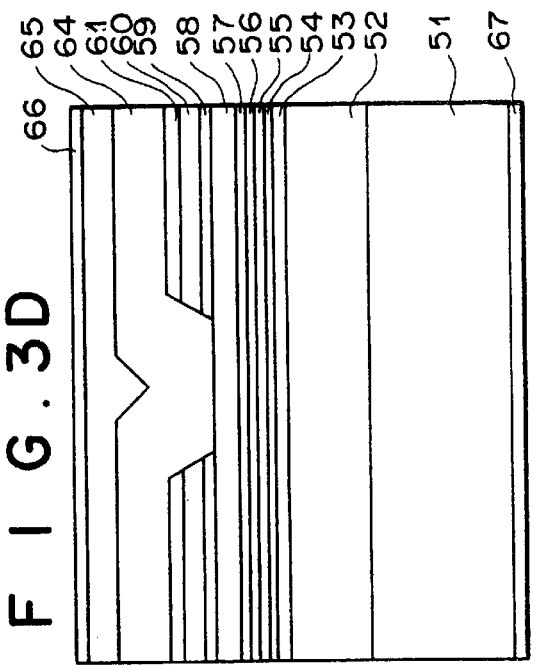
Figure 3A:
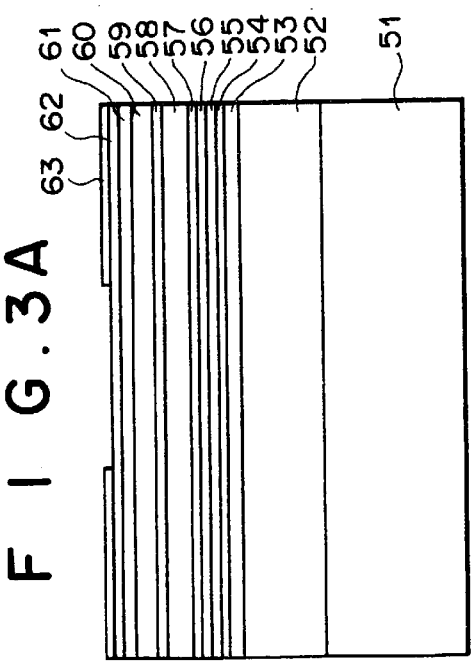

First, as illustrated in FIG. 3A, an n-type $Al_{z1}Ga_{1-z1}As$ lower cladding layer 52 (0.35≦z1≦0.7), an n-type or i-type $Al_{z2}Ga_{1-z2}As$ optical waveguide layer 53 (0≦z2≦0.2), an $In_{x5}Ga_{1-x5}As_{1-y5}P_{y5}$ tensile strain barrier layer 54 (0≦x5≦0.3, 0<y5≦0.6), an $In_{x3}Ga_{1-x3}As_{1-y3}P_{y3}$ compressive strain quantum well active layer 55 (0<x3≦0.4, $0 \leq y3 \leq 0.1$), an $In_{x5}Ga_{1-x5}As_{1-y5}P_{y5}$ tensile strain barrier layer 56 ($0<x5 \leq 0.3$, $0 \leq y5 \leq 0.6$), a p-type or i-type $Al_{z2}Ga_{1-z2}As$ optical waveguide layer 57 ($0 \leq z2 \leq 0.2$), a p-type $In_{0.49}Ga_{0.51}P$ first upper cladding layer 58, an n-type or p-type $In_{x1}Ga_{1-x1}As_{1-y1}P_{y1}$ etching stop layer 59 ($0 \leq x1 \leq 0.3, 0 \leq y1 \leq 0.6$) having a thickness of, for example, 20 nm, an n-type $In_{0.49}(Al_{z1}Ga_{1-z1})_{0.51}P$ current confinement layer 60 ($0 \leq z1 \leq 0.1$) having a thickness of, for example, 1 μm, an n-type $In_{0.49}Ga_{0.51}P$ cap layer 61, and an n-type GaAs cap layer 62 having a thickness of, for example, 10 nm are formed on an n-type GaAs substrate 51 by organometallic vapor phase epitaxy. Then, a $SiO_2$ film 63 is formed over the n-type GaAs cap layer 62, and a stripe area having a width of about 3 μm and extending in the <011> direction, of the $SiO_2$ film 63 is removed by normal photolithography.

Next, as illustrated in FIG. 3B, the n-type GaAs cap layer 62 is etched with a sulfuric acid etchant by using the $SiO_2$ film 63 as a mask. Then, the stripe areas of the n-type $In_{0.49}Ga_{0.51}P$ cap layer 61 and the n-type $In_{0.49}(Al_{z1}Ga_{1-z1})_{0.51}P$ current confinement layer 60 are etched with a hydrochloric acid etchant until the n-type or p-type $In_{x1}Ga_{1-x1}As_{1-y1}P_{y1}$ etching stop layer 59 is exposed.

Figure 3C:
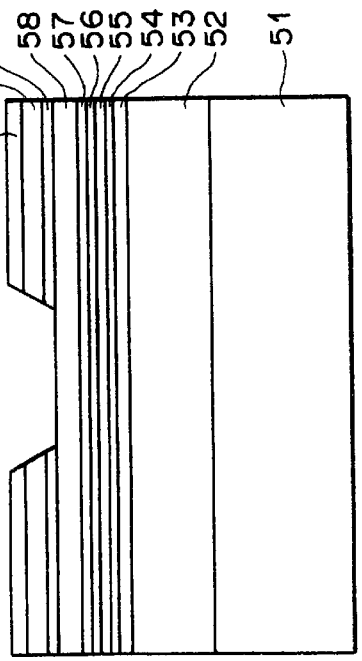

Thereafter, as illustrated in FIG. 3C, the remaining areas of the $SiO_2$ film 63 are removed by etching using a fluoric acid etchant. Then, the n-type GaAs cap layer 62 and the exposed area of the n-type or p-type $In_{x1}Ga_{1-x1}As_{1-y1}P_{y1}$ etching stop layer 59 are removed by etching using a sulfuric acid etchant.

Finally, as illustrated in FIG. 3D, an $In_{x4}Ga_{1-x4}As_{1-y4}P_{y4}$ second upper cladding layer 64 (x4=(0.49±0.01)y4, $0.9 \leq y4 \leq 1$) and a p-type GaAs contact layer 65 are formed over the construction of FIG. 3C. Then, a p electrode 66 is formed on the p-type GaAs contact layer 65. In addition, the exposed surface of the substrate 51 is polished, and an n electrode 67 is formed on the polished surface of the substrate 51. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type $In_{0.49}Ga_{0.51}P$ first upper cladding layer 58 has such thickness that oscillation in a fundamental transverse mode can be maintained even when output power becomes high.

In the construction of the third embodiment, the $In_{x3}Ga_{1-x3}As_{1-y3}P_{y3}$ compressive strain quantum well active layer 55 is also sandwiched between the $In_{x5}Ga_{1-x5}As_{1-y5}P_{y5}$ tensile strain barrier layers 54 and 56. Therefore, compared with the first embodiment, characteristics are improved (e.g., the threshold current is lowered), and reliability is increased.

Fourth Embodiment

Figure 4A:
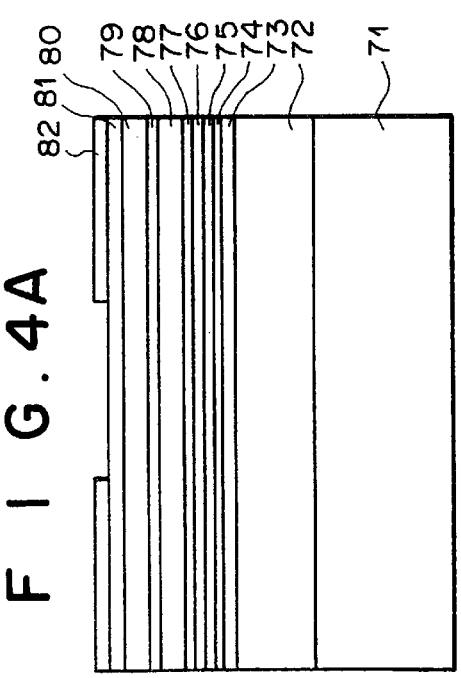
FIGS. 4A to 4C are cross-sectional views of representative stages in the process for producing a semiconductor laser device as the fourth embodiment.
Figure 4B:
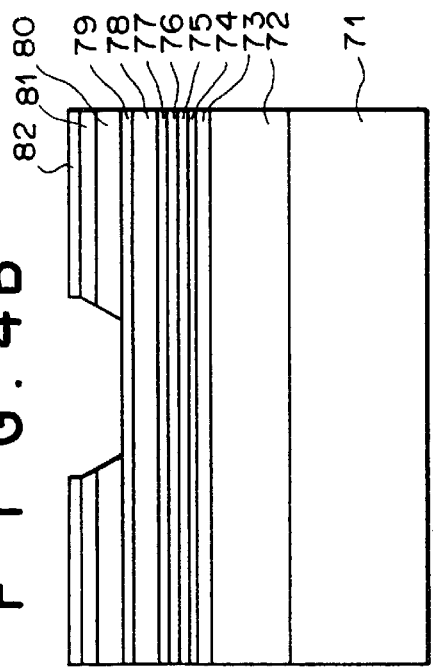
Figure 4C:
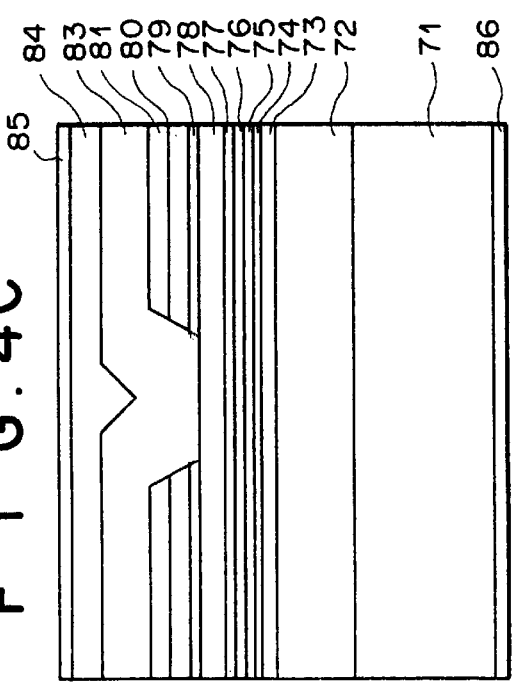

FIGS. 4A to 4C show cross sections of the representative stages in the process for producing a semiconductor laser device as the fourth embodiment, where the cross sections are perpendicular to the direction of light emitted from the semiconductor laser device.

First, as illustrated in FIG. 4A, an n-type $In_{0.49}Ga_{0.51}P$ lower cladding layer 72, an n-type or i-type $In_{x2}Ga_{1-x2}As_{1-y2}P_{y2}$ optical waveguide layer 73 (x2=(0.49±0.01)y2, $0 \leq x2 \leq 0.3$), an $In_{x5}Ga_{1-x5}As_{1-y5}P_{y5}$ tensile strain barrier layer 74 ($0 \leq x5 \leq 0.3$, $0<y5 \leq 0.6$), an $In_{x3}Ga_{1-x3}As_{1-y3}P_{y3}$ compressive strain quantum well active layer 75 ($0<x3 \leq 0.4$, $0 \leq y3 \leq 0.1$), an $In_{x5}Ga_{1-x5}As_{1-y5}P_{y5}$ tensile strain barrier layer 76 ($0 \leq x5 \leq 0.3$, $0<y5 \leq 0.6$), a p-type or i-type $In_{x2}Ga_{1-x2}As_{1-y2}P_{y2}$ optical waveguide layer 77 (x2=(0.49±0.01)y2, $0 \leq x2 \leq 0.3$), a p-type $In_{0.49}Ga_{0.51}P$ first upper cladding layer 78, an n-type or p-type $In_{x1}Ga_{1-x1}As_{1-y1}P_{y1}$ etching stop layer 79 ($0 \leq x1 \leq 0.3, 0 \leq y1 \leq 0.6$) having a thickness of, for example, 20 nm, an n-type $In_{0.49}(Al_{z1}Ga_{1-z1})_{0.51}P$ current confinement layer 80 ($0 \leq z1 \leq 0.1$) having a thickness of, for example, 1 μm, and an n-type $In_{0.49}Ga_{0.51}P$ cap layer 81 are formed on an n-type GaAs substrate 71 by organometallic vapor phase epitaxy. Then, a $SiO_2$ film 82 is formed over the n-type $In_{0.49}(Al_{z1}Ga_{1-z1})_{0.51}P$ current confinement layer 80, and a stripe area having a width of about 3 μm and extending in the <011> direction, of the $SiO_2$ film 82 is removed by normal photolithography.

Next, as illustrated in FIG. 4B, the n-type $In_{0.49}Ga_{0.51}P$ cap layer 61 and the n-type $In_{0.49}(Al_{z1}Ga_{1-z1})_{0.51}P$ current confinement layer 80 are etched with a hydrochloric acid etchant by using the $SiO_2$ film 82 as a mask until the n-type or p-type $In_{x1}Ga_{1-x1}As_{1-y1}P_{y1}$ etching stop layer 79 is exposed. Then, the remaining areas of the $SiO_2$ film 82 are removed by etching using a fluoric acid etchant, and the exposed area of the n-type or p-type $In_{x1}Ga_{1-x1}As_{1-y1}P_{y1}$ etching stop layer 79 is removed by etching using a sulfuric acid etchant.

Thereafter, as illustrated in FIG. 4C, an $In_{x4}Ga_{1-x4}As_{1-y4}P_{y4}$ second upper cladding layer 83 (x4=(0.49±0.01)y4, $0.9 \leq y4 \leq 1$) and a p-type GaAs contact layer 84 are formed over the construction of FIG. 4B. Then, a p electrode 85 is formed on the p-type GaAs contact layer 84. In addition, the exposed surface of the substrate 71 is polished, and an n electrode 86 is formed on the polished surface of the substrate 71. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type $In_{0.49}Ga_{0.51}P$ first upper cladding layer 78 has such a thickness that oscillation in a fundamental transverse mode can be maintained even when output power becomes high.

As described above, it is possible to produce a semiconductor laser apparatus according to the present invention without forming a GaAs cap layer on the n-type $In_{.49}Ga_{0.51}P$ cap layer.

Additional Matters (i) Due to the $In_{x3}Ga_{1-x3}As_{1-y3}P_{y3}$ compressive strain quantum well active layers ($0<x3 \leq 0.4$, $0 \leq y3 \leq 0.1$), the oscillation wavelengths of the semiconductor laser devices as the first to fourth embodiments can be controlled in the range of 900 to 1,200 nm.

(ii) The constructions of the first to fourth embodiments can be used not only in index-guided structure semiconductor laser devices, but also in other semiconductor laser devices having a diffraction grating, as well as in optical integrated circuits.

(iii) The constructions of the first to fourth embodiments can be used not only in semiconductor laser devices oscillating in a fundamental transverse mode, but also in wide-stripe index-guided semiconductor laser devices oscillating in multiple modes and having a stripe width of 3 μm or more.

(iv) Although n-type GaAs substrates are used in the constructions of the first to fourth embodiments, instead, p-type GaAs substrates may be used. When the GaAs substrate is a p-type, the conductivity types of all of the other layers in the constructions of the first to fourth embodiments should be inverted.

(v) Although the constructions of the first to fourth embodiments have a so-called single-quantum-well separate-confinement heterostructure (SQW-SCH) which includes a single quantum well and an optical waveguide made of a material having fixed composition, instead, a multiple quantum well structure made of a plurality of quantum wells may be used.

(vi) Each layer in the constructions of the first to fourth embodiments may be formed by molecular beam epitaxy using solid or gas raw material.

(vii) In addition, all of the contents of the Japanese Patent Application No. 11(1999)-222171 are incorporated into this specification by reference.

What is claimed is:

1. A semiconductor laser device comprising:
   a GaAs substrate of a first conductive type;
   a lower cladding layer of said first conductive type, formed on said GaAs substrate;
   a lower optical waveguide layer formed on said lower cladding layer;
   a compressive strain quantum well active layer made of $In_{x3}Ga_{1-x3}As_{1-y3}P_{y3}$, and formed on said lower optical waveguide layer, where $0<x3\leq0.4$, $0\leq y3\leq0.1$, and an absolute value of a first product of a strain and a thickness of said compressive strain quantum well active layer is equal to or smaller than 0.25 nm;
   an upper optical waveguide layer formed on said $In_{x3}Ga_{1-x3}As_{1-y3}P_{y3}$ compressive strain quantum well active layer;
   a first upper cladding layer made of $In_{0.49}Ga_{0.51}P$ of a second conductive type, and formed on said upper optical waveguide layer;
   an etching stop layer made of $In_{x1}Ga_{1-x1}As_{1-y1}P_{y1}$, and formed on said first upper cladding layer other than a stripe area of said first upper cladding layer so as to form a first portion of a stripe groove realizing a current injection window, where $0\leq x1\leq0.3$, $0\leq y1\leq0.6$, and an absolute value of a second product of a strain and a thickness of said etching stop layer is equal to or smaller than 0.25 nm;
   a current confinement layer made of $In_{0.49}(Al_{z1}Ga_{1-z1})_{0.51}P$ of said first conductive type, and formed on said etching stop layer so as to form a second portion of said stripe groove, where $0<z1\leq0.1$;
   a cap layer made of $In_{0.49}Ga_{0.51}P$, and formed on said current confinement layer so as to form a third portion of said stripe groove;
   a second upper cladding layer made of $In_{x4}Ga_{1-x4}As_{1-y4}P_{y4}$ of said second conductive type, and formed on said current confinement layer and said stripe area of the first upper cladding layer, where $x4=(0.49\pm0.01)y4$ and $0.9\leq y4\leq1$; and
   a contact layer of said second conductive type, formed on said second upper cladding layer;
   wherein each of said lower cladding layer, said lower optical waveguide layer, said upper optical waveguide layer, said first upper cladding layer, said current confinement layer, said cap layer, said second upper cladding layer, and said contact layer has such a composition as to lattice-match with said GaAs substrate.

2. A semiconductor laser device according to claim 1, further comprising first and second tensile strain barrier layers both made of $In_{x5}Ga_{1-x5}As_{1-y5}P_{y5}$, and respectively formed above and below said compressive strain quantum well active layer, where $0\leq x5\leq0.3$ and $0<y5\leq0.6$, and
   an absolute value of a sum of said first product and a third product of a strain of said first and second tensile strain barrier layers and a total thickness of the first and second tensile strain barrier layers is equal to or smaller than 0.25 nm.

3. A semiconductor laser device according to claim 1, wherein said etching stop layer is one of said first and second conductive types.

4. A semiconductor laser device according to claim 1, wherein said first cap layer is one of said first and second conductive types and an undoped type.

5. A semiconductor laser device according to claim 4, wherein said stripe groove has a width equal to or greater than 1 $\mu$m.

6. A semiconductor laser device according to claim 1, wherein said lower optical waveguide active layer is said first conductive type, and said upper optical waveguide active layer is said second conductive type.

7. A semiconductor laser device according to claim 1, wherein said compressive strain quantum well active layer has a multiple quantum well structure.

8. A process for producing a semiconductor laser device, comprising the steps of:
   (a) forming a lower cladding layer of a first conductive type on a GaAs substrate of the first conductive type;
   (b) forming a lower optical waveguide layer on said lower cladding layer;
   (c) forming a compressive strain quantum well active layer made of $In_{x3}Ga_{1-x3}As_{1-y3}P_{y3}$, on said lower optical waveguide layer, where $0<x3\leq0.4$, $0\leq y3\leq0.1$, and an absolute value of a first product of a strain and a thickness of said compressive strain quantum well active layer is equal to or smaller than 0.25 nm;
   (d) forming an upper optical waveguide layer on said $In_{x3}Ga_{1-x3}As_{1-y3}P_{y3}$ compressive strain quantum well active layer;
   (e) forming a first upper cladding layer made of $In_{0.49}Ga_{0.51}P$ of a second conductive type, on said upper optical waveguide layer;
   (f) forming an etching stop layer made of $In_{x1}Ga_{1-x1}As_{1-y1}P_{y1}$, on said first upper cladding layer, where $0\leq x1\leq0.3$ and $0\leq y1\leq0.6$, and an absolute value of a second product of a strain and a thickness of said etching stop layer is equal to or smaller than 0.25 nm;
   (g) forming a current confinement layer made of $In_{0.49}(Al_{z1}Ga_{1-z1})_{0.51}P$ of the first conductive type, on said etching stop layer, where $0\leq z1\leq0.1$;
   (h) forming a first cap layer made of $In_{0.49}Ga_{0.51}P$, on said current confinement layer;
   (i) removing a stripe area of said first cap layer and a stripe area of said current confinement layer so as to form a first portion of a stripe groove for realizing a current injection window;
   (j) removing a stripe area of said etching stop layer so as to form a second portion of said stripe groove;
   (k) forming a second upper cladding layer made of $In_{x4}Ga_{1-x4}As_{1-y4}P_{y4}$ of the second conductive type so that said stripe groove is covered with the second upper cladding layer, where $x4=(0.49\pm0.01)y4$ and $0.9\leq y4\leq1$; and
   (l) forming a contact layer of said second conductive type, on said second upper cladding layer;
   wherein each of said lower cladding layer, said lower optical waveguide layer, said upper optical waveguide layer, said first upper cladding layer, said current confinement layer, said first cap layer, said second upper cladding layer, and said contact layer has such a composition as to lattice-match with said GaAs substrate.

9. A process according to claim 8, further comprising, after said step (h), the steps of,
(h1) forming a second cap layer made of GaAs, and
(h2) removing a stripe area of said second cap layer; and in said step (j), a remaining area of said second cap layer is removed together with said stripe area of said etching stop layer so as to form an additional portion of said stripe groove.

10. A process according to claim 8, wherein said etching stop layer is one of said first and second conductive types.

11. A process according to claim 8, wherein said first cap layer is one of said first and second conductive types and an undoped type.

12. A process according to claim 8, wherein said second cap layer is one of said first and second conductive types and an undoped type.

13. A process according to claim 8, further comprising the steps of,
(b1) after said step (b), forming a first tensile strain barrier layer made of $In_{x5}Ga_{1-x5}As_{1-y5}P_{y5}$, on said lower optical waveguide layer, where $0 \leq x5 \leq 0.3$ and $0 < y5 \leq 0.6$, and
(c1) after said step (c), forming a second tensile strain barrier layer made of $In_{x5}Ga_{1-x5}As_{1-y5}P_{y5}$, on said compressive strain quantum well active layer,
where an absolute value of a sum of said first product and a third product of a strain of said first and second tensile strain barrier layers and a total thickness of the first and second tensile strain barrier layers is equal to or smaller than 0.25 nm.

* * * * *